US012080342B2

(12) United States Patent
Pao et al.

(10) Patent No.: US 12,080,342 B2
(45) Date of Patent: Sep. 3, 2024

(54) STATIC RANDOM ACCESS MEMORY (SRAM) WITH A PRE- CHARGE ASSIST CIRCUIT

(71) Applicant: Taiwan Semiconductor Manufacturing Company, Ltd., Hsinchu (TW)

(72) Inventors: Chia-Hao Pao, Kaohsiung (TW); Kian-Long Lim, Hsinchu (TW); Chih-Chuan Yang, Hsinchu (TW); Jui-Wen Chang, Hsinchu (TW); Chao-Yuan Chang, New Taipei (TW); Feng-Ming Chang, Zhubei (TW); Lien-Jung Hung, Taipei (TW); Ping-Wei Wang, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 244 days.

(21) Appl. No.: 17/698,681

(22) Filed: Mar. 18, 2022

(65) Prior Publication Data

US 2022/0406372 A1 Dec. 22, 2022

Related U.S. Application Data

(60) Provisional application No. 63/212,271, filed on Jun. 18, 2021.

(51) Int. Cl.
*G11C 11/419* (2006.01)

(52) U.S. Cl.
CPC .................. *G11C 11/419* (2013.01)

(58) Field of Classification Search
CPC ........ G11C 11/419; G11C 11/417; G11C 7/12
USPC ........................................... 365/203
See application file for complete search history.

(56) References Cited

U.S. PATENT DOCUMENTS

| 2001/0026488 A1* | 10/2001 | Nishioka ............... G11C 7/12 |
| | | 365/203 |
| 2006/0158943 A1* | 7/2006 | Park ..................... G11C 7/12 |
| | | 365/203 |
| 2009/0141565 A1* | 6/2009 | Koike .................. G11C 11/419 |
| | | 365/189.011 |
| 2016/0365139 A1* | 12/2016 | Braceras ............... G11C 7/12 |

* cited by examiner

*Primary Examiner* — Alexander Sofocleous
*Assistant Examiner* — Tracy R Hampton
(74) *Attorney, Agent, or Firm* — Merchant & Gould P.C.

(57) ABSTRACT

A memory device is provided. The memory device includes a memory cell array having a plurality of memory cells arranged in a matrix of a plurality of rows and a plurality of columns. Each of the plurality of columns include a first plurality of memory cells connected to a first bit line and a second bit line. A pre-charge circuit is connected to the memory cell array. The pre-charge circuit pre-charges each of the first bit line and the second bit line from a first end. A pre-charge assist circuit is connected to the memory cell array. The pre-charge assist circuit pre-charges each of the first bit line and the second bit line from a second end, the second end being opposite the first end.

20 Claims, 6 Drawing Sheets

STATIC RANDOM ACCESS MEMORY (SRAM) WITH A PRE- CHARGE ASSIST CIRCUIT

CROSS REFERENCE TO RELATED APPLICATION

This application claims the benefit of U.S. Provisional Application No. 63/212,271, filed Jun. 18, 2021, and titled "Memory Device," the disclosure of which is hereby incorporated herein by reference.

BACKGROUND

A common type of integrated circuit memory is a static random access memory (SRAM) device. A typical SRAM memory device includes an array of memory cells, with each memory cell having two cross-coupled inverters, which act as a latch storage elements, and two switches connecting the two invertors to complementary bit lines to communicate data into or out of the memory cell. The switches are controlled by a word line. When the switches are off, the memory cell keeps one of its two possible steady states. To write data into the memory cell, the value to be written and its complement are placed onto the bit lines and the word line is raise simultaneously. To read a value from the memory cell, both bit lines are pre-charged high, and the word line is raised. The bit line relative to the memory cell node that contains a zero value begins discharging, providing differing signals that can be sensed and output from the memory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
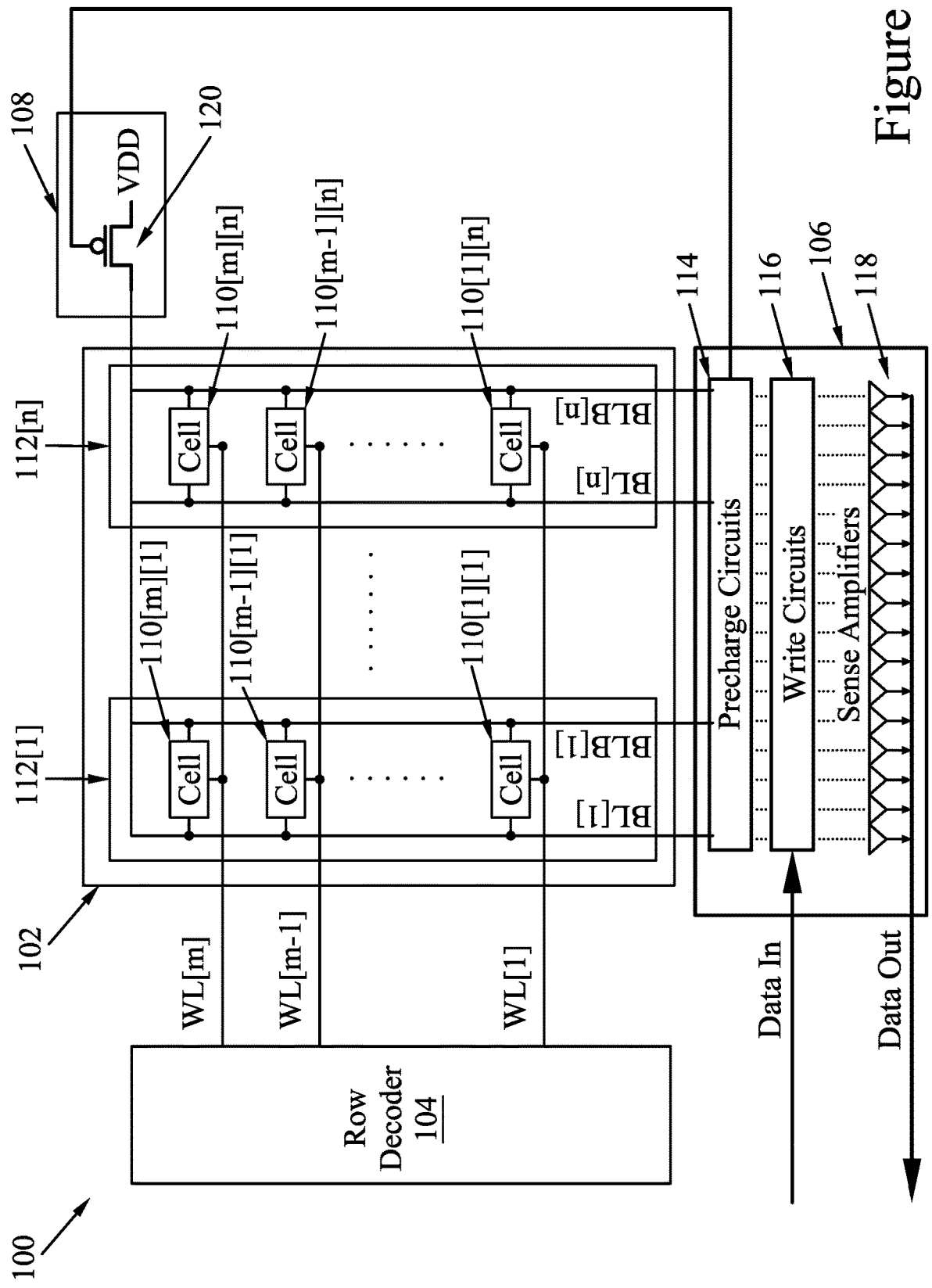
FIG. 1 illustrates an example memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As noted above, read operations are initiated by pre-charging two bit lines to which a memory cell is connected to a predetermined voltage level. When a word line of the memory cell is activated, the memory cell pulls a particular one of the bit lines low. A sense amplifier senses the difference between the two bit lines, and outputs a corresponding data value accordingly. The bit lines are then pre-charged again to facilitate a next read operation. To facilitate high speed operation, the disclosure provides faster pre-charging of the bit lines. More specifically, the disclosure provides a pre-charge assist circuit which facilitates pre-charging of the bit lines from both ends.

FIG. 1 is a diagram illustrating an example memory device 100 in accordance with some embodiments. As shown in FIG. 1, memory device 100 includes a memory cell array 102, a row decoder 104 (also referred to as a word line driver circuit 104), read/write circuits 106, and pre-charge assist circuits 108. It will be apparent to a person with skill in the art after reading this disclosure that memory device 100 can include additional components not shown in FIG. 1.

Memory cell array 102 includes a plurality of memory cells (labeled as 110[1][1], . . . , 110[m−1][1], 110[m][1], . . . , 110[1][n], . . . , 110[m−1][n], and 110[m][n]). Each of the plurality of memory cells can store one bit of information (that is, a bit value 0 or a bit value 1), and are, therefore, also referred to as a bit cell. In some examples, memory cell can be a SRAM, a DRAM, a MRAM, RRAM, etc. An example memory cell is described in greater detail with respect to FIG. 2 of the disclosure. Memory cell array 102 further includes a plurality of word lines (labeled as WL[1], WL[m−1], and WL[m]) and a plurality of bit line pairs (that is, a bit line and bit line bar or a complementary bit line pairs) (labeled as (BL[1], BLB[1]), . . . , BL[n], BLB[n])).

The plurality of memory cells of memory cell array 102 are arranged in a matrix of rows and columns (for example, m rows and n columns). Each of the plurality of columns include a first plurality of memory cells. For example, and as shown in FIG. 1, a [1]th column 112[1] includes a first plurality of memory cells labeled as 110[1][1], . . . , 110[m−1][1], and 110[m][1] continuing to a [n]th column 112[n] that includes a first plurality of memory cells labeled as 110[1][n], . . . , 110[m−1][n], and 110[m][n].

Each column of memory cell array 102 is associated with a bit line pair and each of the first plurality of memory cells of the column are connected to the associated bit line pair. For example, [1]th column 112[1] is associated with a bit line BL[1] and a bit line bar BLB[1] and each of first plurality of memory cells of [1]th column 112[1] (labeled as 110[1][1], ..., 110[m−1][1], and 110[m][1]) are connected to both bit line BL[1] and bit line bar BLB[1]. Similarly, [n]th column 112[n] is associated with a bit line BL[n] and a bit line bar BLB[n] and each of first plurality of memory cells of [n]th column 112[n] (labeled as 110[1][n], ..., 110[m−1][n], and 110[m][n]) are connected to both bit line BL[n] and bit line bar BLB[n].

Each row of memory cell array 102 includes a second plurality of cells. For example, a [1]th row includes a second plurality of memory cells labeled as 110[1][1], ..., 110[1][n] continuing to a [m−1]th row that includes a second plurality of memory cells labeled as 110[m−1][1], ..., 110[m−1][n], and a [m]th row that includes a second plurality of memory cells labeled as 110[m][1], ..., 110[m][n]. In addition, each row is associated with a word line and each of the second plurality of memory cells of the row are connected to the associated word line. For example, the [1]th row is associated with a word line WL[1] and each of second plurality of memory cells of the [1]th row (labeled as 110[1][1], ..., 110[1][n]) are connected to the word line WL[1]. Similarly, the [m−1]th row is associated with a word line WL[m−1], and each of second plurality of memory cells of the [m−1]th row (labeled as 110[m−1][1], ..., 110[m−1][n]) are connected to the word line WL[m−1]. Additionally, the [m]th row is associated with a word line WL[m], and each of second plurality of memory cells of the [m−1]th row (labeled as 110[m][1], ..., 110[m][n]) are connected to the word line WL[m].

Figure 2:
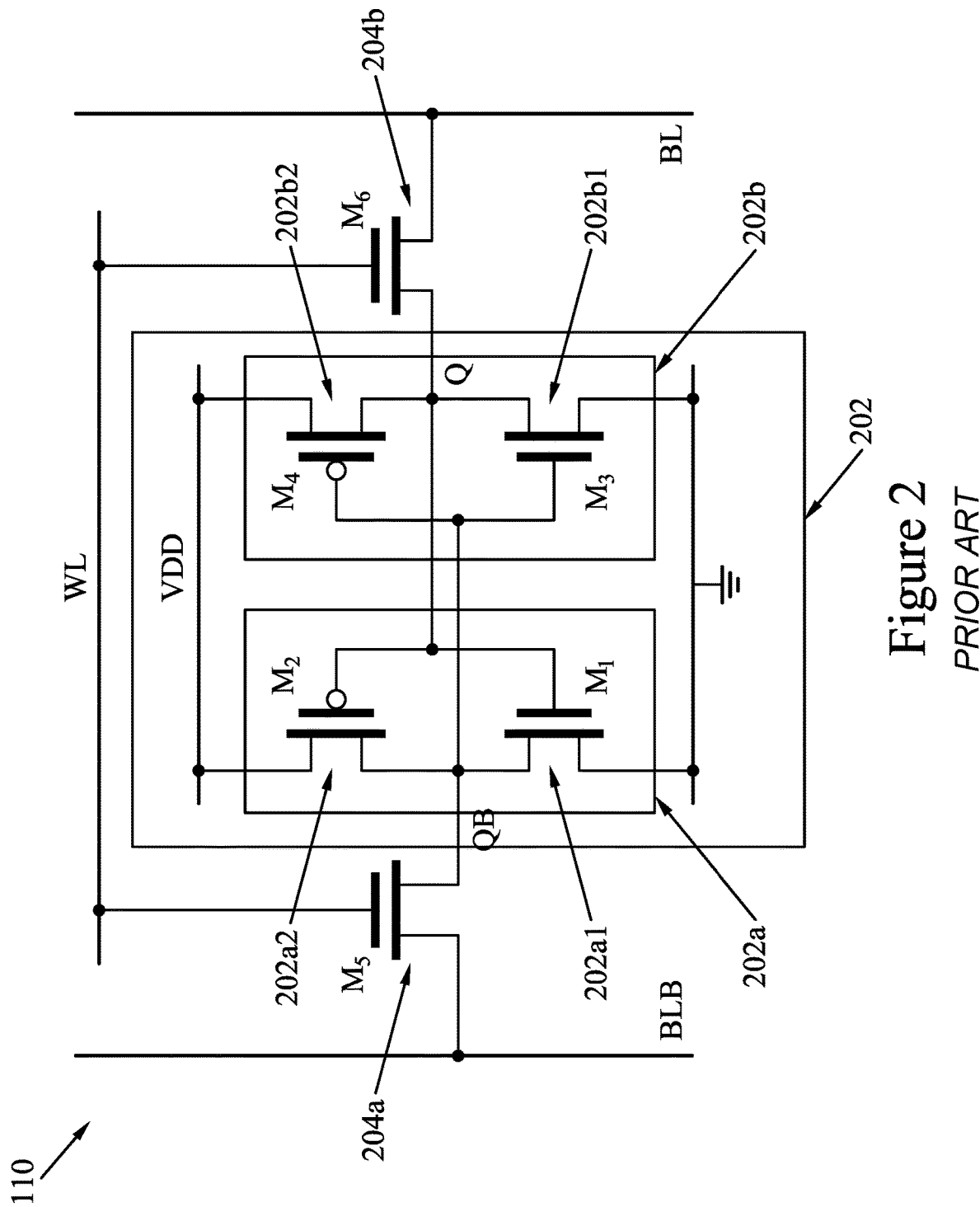
FIG. 2 illustrates an example memory cell of a memory device, in accordance with some embodiments.

FIG. 2 is a circuit diagram of an example memory cell 110 of memory cell array 102 in accordance with some embodiments. Memory cell 110 of FIG. 2 is a SRAM device. However, other type of memory devices, for example, a DRAM, a MRAM, a RRAM, etc. are within the scope of the disclosure. As shown in FIG. 2, memory cell 110 includes a pair of cross coupled invertors 202. Cross coupled invertors 202 includes a first invertor 202a and a second invertor 202b. First invertor 202a is connected between a supply voltage VDD and the ground. Similarly, second invertor 202b is also connected between the supply voltage VDD and the ground. In examples, first invertor 202a is cross coupled with second invertor 202b at a node Q and at a node QB. Cross coupled invertors 202 store a first bit value at a node Q and a second bit value at a node QB. Hence, the node Q may also be referred to as a first data node and the node QB may also be referred to as a second data node. In examples, the node QB is complementary to the node Q.

First invertor 202a includes a first invertor first transistor 202a1 (also labeled as M1) and a first invertor second transistor 202a2 (also labeled as M2). A source of first invertor first transistor 202a1 is connected to the node QB and a drain of first invertor first transistor 202a1 is connected to the ground. A source of first invertor second transistor 202a2 is connected to the supply voltage VDD and a drain of first invertor second transistor 202a2 is connected to the node QB. A gate of each of first invertor first transistor 202a1 and first invertor second transistor 202a2 is connected to the node Q thereby cross-coupling first invertor 202a1 202a with second invertor 202b.

In examples, first invertor first transistor 202a1 is a n-channel metal oxide semiconductor (nMOS) transistor and first invertor second transistor 202a2 is an p-channel metal oxide semiconductor (pMOS) transistor. However, it will be apparent to a person with an ordinary skill in the art after reading this disclosure that other types of transistors, such as, a metal oxide semiconductor field effect transistor (MOSFET), an nMOS transistor, a pMOS transistors, or a complementary metal oxide semiconductor (CMOS) transistor can be used for each of first invertor first transistor 202a1 and first invertor second transistor 202a2. In addition, each of first invertor first transistor 202a1 and first invertor second transistor 202a2 is symmetrical. That is, a source of each of first invertor first transistor 202a1 and first invertor second transistor 202a2 can be a drain, and a drain can be a source.

Second invertor 202b includes a second invertor first transistor 202b1 (also labeled as M3) and a second invertor second transistor 202b2 (also labeled as M4). A source of second invertor first transistor 202b1 is connected to the node Q and a drain of second invertor first transistor 202b1 is connected to the ground. A source of second invertor second transistor 202b2 is connected to the supply voltage VDD and a drain of second invertor second transistor 202b2 is connected to the node Q. A gate of each of second invertor first transistor 202b1 and second invertor second transistor 202b2 is connected to the node QB thereby cross-coupling second invertor 202b with first invertor 202a.

In examples, second invertor first transistor 202b1 is a nMOS transistor and second invertor second transistor 202b2 is an pMOS transistor. However, it will be apparent to a person with an ordinary skill in art after reading this disclosure that other types of transistors, such as, a MOSFET, an nMOS transistor, a pMOS transistors, or a CMOS transistor can be used for each of second invertor first transistor 202b1 and second invertor second transistor 202b2. In addition, each of second invertor first transistor 202b1 and second invertor second transistor 202b2 is symmetrical. That is, a source of each of second invertor first transistor 202b1 and second invertor second transistor 202b2 can be a drain, and a drain can be a source.

Memory cell 110 further includes a first pass gate transistor 204a (also labeled as M5) and a second pass gate transistor 204b (also labeled as M6). A source of first pass gate transistor 204a is connected to a bit line bar BLB (also referred to as a complementary bit line) and a drain of first pass gate transistor 204a is connected to the node QB. A gate of first pass gate transistor 204a is connected to a word line WL. In addition, a source of second pass gate transistor 204b is connected to a bit line BL and a drain of second pass gate transistor 204b is connected to the node Q. A gate of second pass gate transistor 204b is connected to the word line WL.

In examples, each of first pass gate transistor 204a and second pass gate transistor 204b are nMOS transistors. However, it will be apparent to person with an ordinary skill in the art after reading this disclosure that other types of transistors, such as, a MOSFET, an pMOS transistor, or a CMOS transistor can be used for each of first pass gate transistor 204a and second pass gate transistor 204b. In addition, each of first pass gate transistor 204a and second pass gate transistor 204b is symmetrical. That is, a source of each of first pass gate transistor 204a and second pass gate transistor 204b can be a drain, and a drain can be a source.

When enabled, first pass gate 204a connects the node QB to a complementary bit line BLB. Similarly, when enabled, second pass gate 204b connects node Q to a bit line BL. First pass gate 204a and second pass gate 204a are enabled when the word line WL is selected and charged for read or write operation in memory cell 200.

Referring back to FIG. 1, row decoder 104 is connected to memory cell array 102. Row decoder 104 selects a word line of the plurality of word lines memory cell array 102 and charges the selected word line to a predetermined logical value (for example, a logic high) for a read operation or a write operation. In examples, row decoder 104 circuit includes a plurality of logic operators that decodes an address input to select a word line to charge.

Read write circuits 106 are connected to memory cell array 102 and perform read and write operations in memory cell array 102. In some examples, read write circuits 106 include pre-charge circuits 114, write circuits 116, and sense amplifiers 118. In some examples, sense amplifiers 118 are also referred to as read circuits 118. Although pre-charge circuits 114 is shown to be part of read write circuits 106, in some example, pre-charge circuits 114 can be separate from read write circuits 106. In some examples, read write circuits 106 can include additional components not shown in FIG. 1.

Pre-charge circuits 114 pre-charge bit line pairs of memory cell array 102 to a predetermined voltage level. In some example, pre-charge circuits 114 pre-charge the bit line pairs substantially equal to the supply voltage level (that is, VDD). In some other examples, pre-charge circuits 114 pre-charge the bit line pairs substantially equal to half of the supply voltage level (that is VDD/2). For example, pre-charge circuits 114 pre-charge bit line pairs of memory cell array 102 to VDD in anticipation for read operations. In example embodiments, pre-charge circuits 114 pre-charge the bit line pairs from a first end or a near end. In example, the near end refers to ends of the bit line pairs which are closest in distance to pre-charge circuits 114. In example, the distance can refer to physical distance or a length of a connector.

Write circuits 116 provide data to be stored in memory cell array 102. For example, write circuits 116 provide bit values to be stored in the node Q and the node QB of one or more memory cells of memory cell array 102 for write operations. For the write operations, write circuits 116 are connected to the node Q and the node QB of one or memory cells through the bit line pairs when a corresponding word line WL is charged to a logic high and store the bit values at the node Q and the node QB.

Sense amplifiers 118 compare a voltage level on a bit line with a voltage level on a bit line bar and provide an output representative of data stored in a memory cell of memory cell array 102 for read operations. For example, the bit line and the bit line bar are connected to the node Q and node QB respectively when an associated word line WL is charged to a logic high for the read operations. When connected, the voltage levels on the bit line and the bit line bar change from the pre-charge voltage levels. Sense amplifiers 118 compare the voltage levels on the bit line and the bit line bar and provide an output indicative of the stored value on the node Q and node QB based on the comparison.

Pre-charge assist circuits 108 assist in pre-charging of the bit line pairs. In some examples, pre-charge assist circuits 108 pre-charge the bit line pairs from a second end which is opposite the first end from where pre-charge circuits 114 pre-charge the bit line pairs. The second end is also referred to as a far end. In some examples, pre-charge assist circuits 108 pre-charge the bit line pairs substantially simultaneously with pre-charge circuits 114 thereby increasing a speed of pre-charge and uniformity of pre-charge of the bit line pairs. Pre-charge assist circuits 108 assist in pre-charging of the bit line pairs by connecting the second end of the bit line pairs to the supply voltage VDD (or other pre-determined voltage, for example, VDD/2) in response to pre-charge assist signal or an enable signal. For example, pre-charge assist circuits 108 connect the second end of the bit line pairs to the supply voltage VDD in response to the pre-charge assist signal dropping to a logic low. In some examples, the pre-charge assist signal is received from pre-charge circuits 114. In some examples, pre-charge circuits 114 send the pre-charge assist signal at conclusion of a read operation or a write operation. In some other examples, pre-charge circuits 114 send the pre-charge assist signal in anticipation of a read operation or a write operation.

Figure 3:
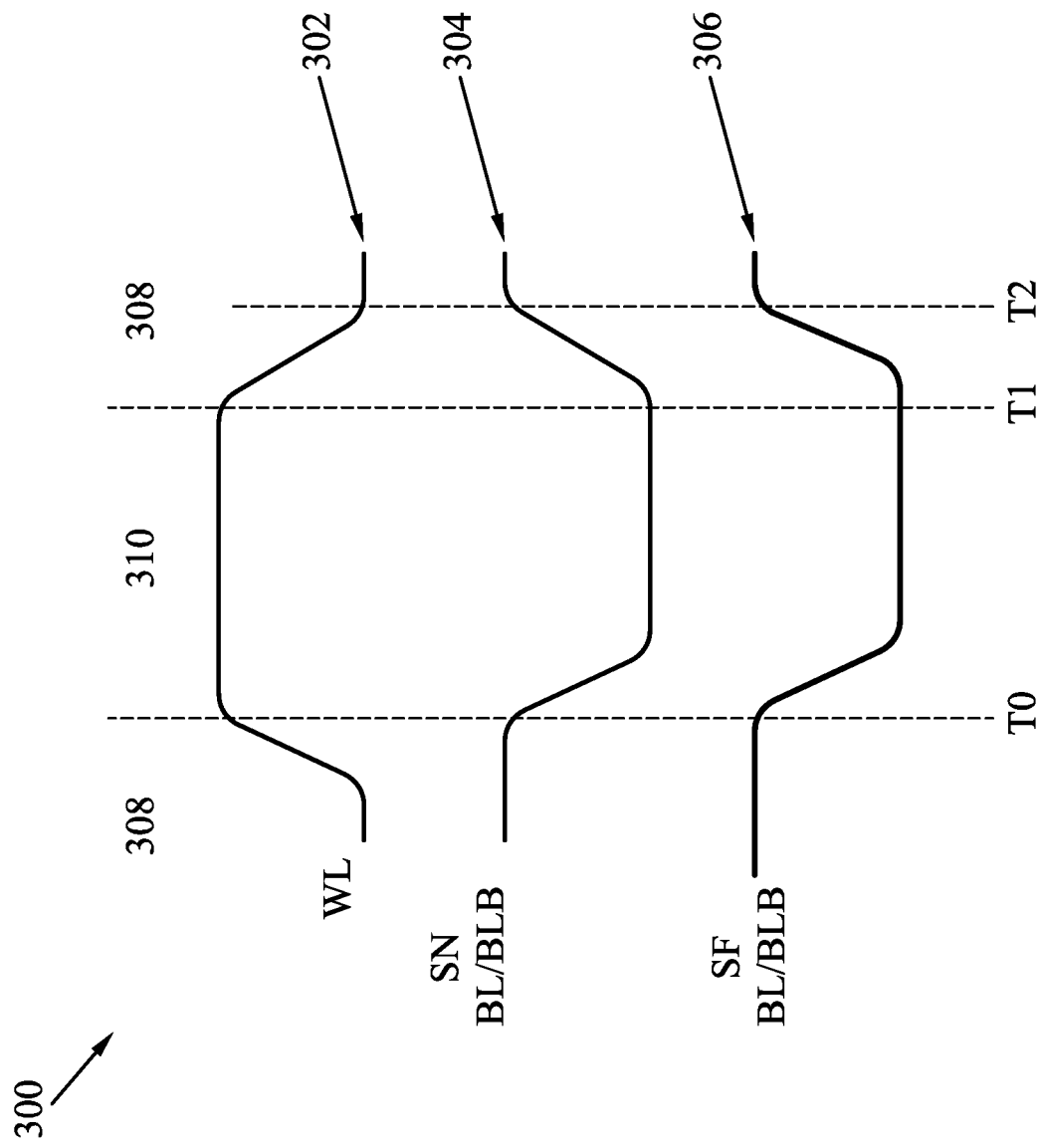
FIG. 3 is a graph illustrating voltage levels of a memory device during a read operation, in accordance with some examples.

FIG. 3 illustrates a graph 300 indicative of voltage levels in memory device 100 in accordance with some embodiments. More specifically, FIG. 3 illustrates graph 300 indicative of voltage levels on the bit line pairs during a read operation on one or more memory cells of memory cell array 102 of memory device 100. For example, a first plot 302 of graph 300 is indicative of a voltage level on a selected word line WL, a second plot 304 of graph 300 is indicative of a voltage level on a near end of a bit line pair (labeled SN BL/BLB), and a third plot 306 of graph 300 is indicative of a voltage level on a far end of the bit line pair (labeled as SF BL/BLB).

As shown in FIG. 3, in a pre-charge state 308, the voltage level on the word line WL is at a logic low, the voltage level on the near end of the bit line pair (SN BL/BLB) is at a logic high, and a voltage level on the far end bit line pair (SF BL/BLB) is also at a logic high. From pre-charge state 308, the read operation transitions to read state 310. For example, read state 310 is enabled at time TO through the read enable signal. In read state 310, and as shown in first plot 302, the selected word line WL is charged to a logic high. In addition, in read state 310 the bit line pair is disconnected from pre-charge circuits 114 and is connected to the node Q and the node QB of memory cell 110. Thus, and as shown in second plot 304, the voltage level of the near end of the bit line pair (SN BL/BLB) drops from the pre-charge voltage level. Moreover, and as shown in third plot 306, the voltage level of the far end of the bit line pair (SF BL/BLB) also drops from the pre-charge voltage level.

After read state 310, the read operation transitions back to pre-charge state 308 in which the word line WL is de-asserted and the bit line pair is pre-charged for a next read or write operation. For example, and as shown in graph 300, the read operation transitions from read state 310 to pre-charge state 308 at time T1. In pre-charge state, the bit line pair are pre-charged to the pre-charge voltage level. For example, and as shown in first plot 302, the word line WL is de-asserted and the voltage level of the word line drops to a logic low. In addition, and as shown in second plot 304, the voltage level on the near end of the bit line pair rises to the pre-charge voltage level at time T2. Similarly, and as shown in third plot 306, the voltage level on the far end of the bit line pair also rises to the pre-charge voltage level at time T2. Thus, and in accordance with the example embodiments, the pre-charge voltage levels are reached substantially simultaneously at both ends of the bit line pair.

Referring back to FIG. 1, pre-charge assist circuits 108 include a pre-charge assist circuit transistor 120. In some examples, pre-charge assist circuit transistor 120 is a PMOS transistor. A source of pre-charge assist circuit transistor 120 is connected to the supply voltage VDD. A drain of pre-charge assist circuit transistor 120 is connected to the bit line pairs of memory cell array 102. A gate of pre-charge assist circuit transistor 120 receives the pre-charge assist signal, for example, from pre-charge circuits 114. In response to receiving the pre-charge assist signal (or the pre-charge assist signal dropping to a logic low), pre-charge assist circuit transistor 120 is enabled connecting the second end of the bit line pairs with the supply voltage VDD. In some examples, pre-charge assist circuit transistor 120 can connects the second end of the bit line pairs with other voltages, for example, VDD/2.

Although pre-charge assist circuit transistor 120 is shown to be a PMOS transistor, other types of transistors (for example, a MOSFET, an nMOS transistor, or a CMOS transistor) are within the scope for pre-charge assist circuit transistor 120. Moreover, pre-charge assist circuit transistor 120 is symmetrical. That is, a source of pre-charge assist circuit transistor 120 can be a drain and a drain of pre-charge assist circuit transistor 120 can be a source.

Figure 4:
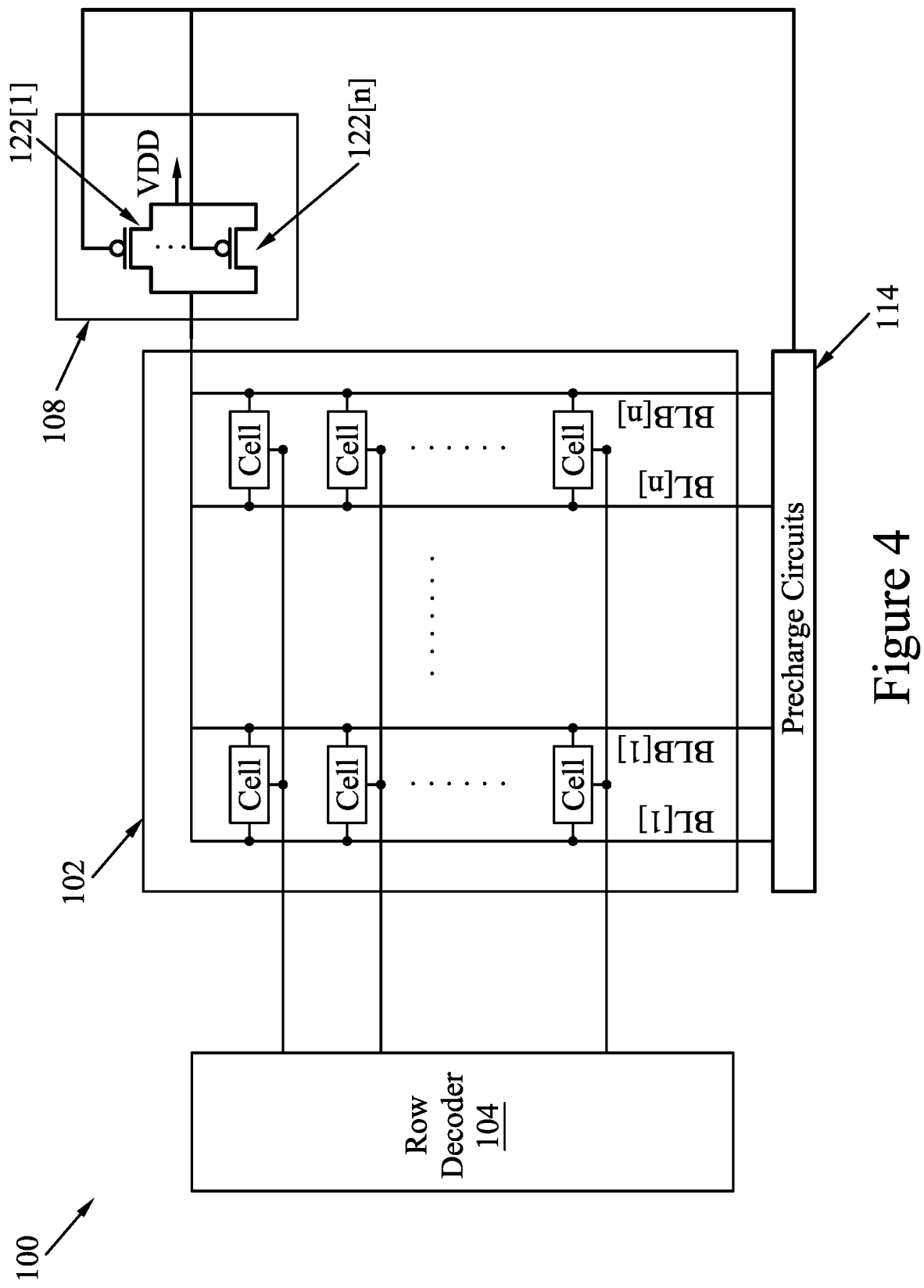
FIG. 4 illustrates another example of memory device, in accordance with some examples.

In examples, pre-charge assist circuits 108 can include more than one transistor. FIG. 4 illustrates an example memory device 100 with pre-charge assist circuits 108 that include more than one transistors in accordance with some embodiments. For example, and as shown in FIG. 4, pre-charge assist circuits 108 include a plurality of transistors (labeled as 122[1], . . . , 122[n]). The plurality of transistors are connected in parallel to each other. For example, a source of each of the plurality of transistors is connected the supply voltage VDD and a drain of each of the plurality of transistors is connected to the bit line pairs of memory cell array 102. A gate of each of the plurality of transistors receive the pre-charge assist signal and connect the second end of the bit line pairs to the supply voltage in response to receiving the pre-charge assist signal. In some example, the source of each of the plurality of transistors can be connected to other voltage levels, for example, VDD/2.

In addition, each of the plurality of transistors are shown to be PMOS transistors, other transistors, for example, a MOSFET, an nMOS transistor, or a CMOS transistor are within the scope of the disclosure. In addition, each of the plurality of transistors are symmetrical. That is, a source of each of the plurality of transistors can be a drain and a drain of each of the plurality of transistors can be a source, In some example, a number of the plurality of transistors in pre-charge assist circuits 108 is determined based on a number of memory cells in a column of memory cell array 102. For example, the plurality of transistors include one transistor when the number of memory cells in a column is less than or equal to 128. In another example, the plurality of transistors include two transistors when the number of memory cells in a column is more than 128 and less than or equal to 256. That is, the plurality of transistors can include one transistor for every 128 memory cells in a column of memory cell array 102. However, a different number of memory cells (for example, 32, 64, 256, etc.) is within the scope of the disclosure.

Figure 5:
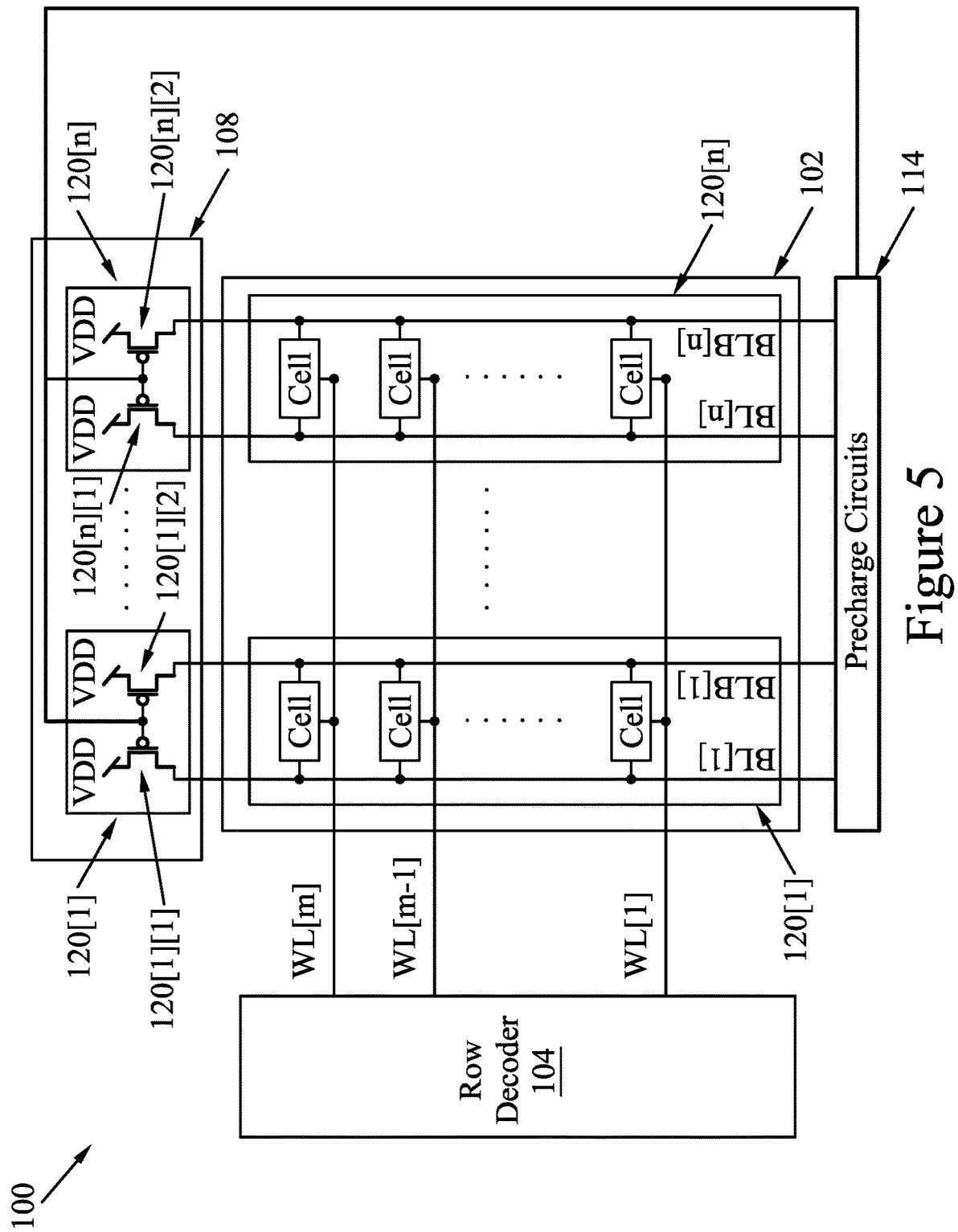
FIG. 5 illustrates yet another example of a memory device, in accordance with some examples.

In some examples, pre-charge assist circuits 108 can include a transistor pair for each bit line pairs. FIG. 5 illustrates an example memory device 100 with pre-charge assist circuits 108 that include a transistor pair for each bit line pair in accordance with some embodiments. For example, and as shown in FIG. 5, pre-charge assist circuits 108 include a plurality of transistor pairs (labeled as 120[1], . . . , 120[n]. Each of the plurality of transistors pairs are associated with one of the plurality of bit line pairs. For example, a [1]th transistor pair 120[1] is associated with [1]th bit line pair BL[1]/BLB[1], continuing to [n]th transistor pair 120[n] which is associated with [n]th bit line pair BL[n]/BLB[n].

Each of the plurality of transistor pairs include two transistors. For example, [1]th transistor pair 120[1] includes a first transistor 120[1][1] and a second transistor 120[1][2]. First transistor 120[1][1] is associated with the bit line BL[1] and second transistor 120[1][2] is associated with bit line bar BLB[1]. For example, a source of first transistor 120[1][1] is connected to the supply voltage VDD and a drain of first transistor 120[1][1] is connected to the second end of bit line BL[1]. Similarly, a source of second transistor 120[1][2] is connected to the supply voltage VDD and a drain of second transistor 120[1][2] is connected to the second end of bit line bar BLB[1]. A gate of each of first transistor 120[1][1] and second transistor 120[1][2] receives pre-charge assist signal and connects the second end of both bit line BL[1] and bit line bar BLB[1] to the supply voltage in response to receiving the pre-charge assist signal, thereby pre-charging both bit line BL[1] and bit line bar BLB[1] from the second end.

Similarly, [n]th transistor pair includes a first transistor 120[n][1] and a second transistor 120[n][2]. First transistor 120[n][1] is associated with bit line BL[n] and second transistor 120[n][2] is associated with bit line bar BLB[n]. For example, a source of first transistor 120[n][1] is connected to the supply voltage VDD and a drain of first transistor 120[n][1] is connected to the second end of bit line BL[n]. Similarly, a source of second transistor 120[n][2] is connected to the supply voltage VDD and a drain of second transistor 120[n][1] is connected to the second end of bit line bar BLB[n]. A gate of each of first transistor 120[n][1] and second transistor 120[n][2] receives pre-charge assist signal and connects the second end of both bit line BL[n] and bit line bar BLB[n] to the supply voltage in response to receiving the pre-charge assist signal, thereby pre-charging both bit line BL[n] and bit line bar BLB[n] from the second end.

Although each of the plurality of transistor pairs are shown to include inly two transistors, it will be apparent to a person with skill in the art after reading this disclosure that each of the plurality of transistor pairs can include more than two transistors. In addition, each of the plurality of transistor pairs are shown to be PMOS transistors, other transistors, for example, a MOSFET, an nMOS transistor, or a CMOS transistor are within the scope of the disclosure. Moreover, each of the plurality of transistor pairs are symmetrical. That is, a source of each of the plurality of transistor pairs can be a drain and a drain of each of the plurality of transistor pairs can be a source.

Figure 6:
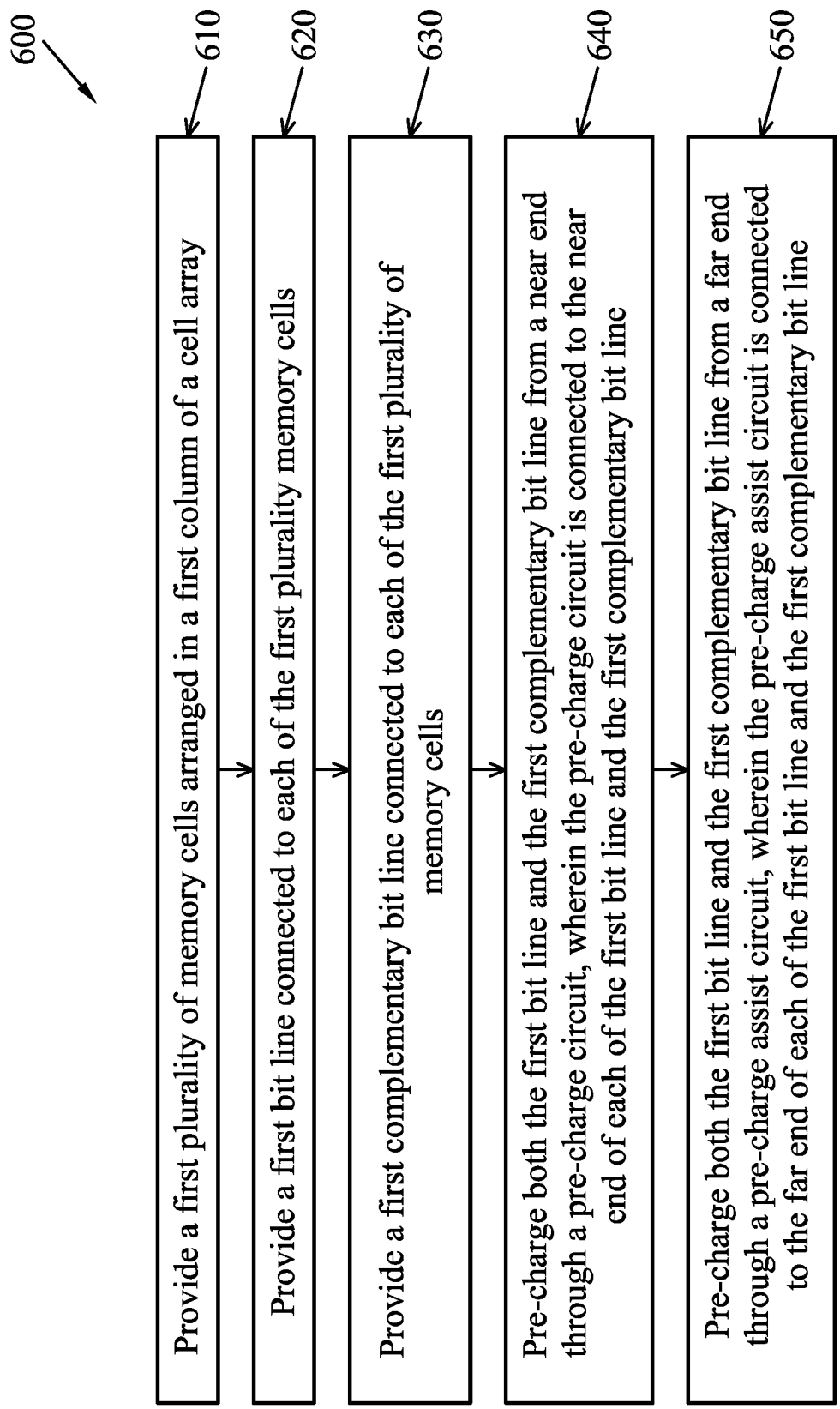
FIG. 6 is a flow diagram illustrating a method for pre-charging bit line pairs of a memory device, in accordance with some examples.

FIG. 6 is a flow diagram of a method 600 of pre-charging bit lines in a memory device in accordance with some embodiments. For example, method 600 is employed to pre-charge the bit line pairs of memory device 100 discussed with reference to FIG. 1-5 of the disclosure.

At block 610 of method 600, a first plurality of memory cells arranged in a first column of a memory cell array are provided. For example, the first plurality of memory cells (labeled as 110[1][1], . . . , 110[m−1][1], and 110[m][1]) arranged in [1]th column 112[1] of memory cell array 102 are provided. In another example, the first plurality of memory cells (labeled as 110[1][n], . . . , 110[m−1][n], and 110[m][n]) arranged in [n]th column 112[n] of memory cell array 102 are provided.

At block 620 of method 600, a first bit line connected to each of the first plurality memory cells is provided. For example, bit line BL[1] connected to each of the first plurality of memory cells (labeled as 110[1][1], . . . , 110[m−1][1], and 110[m][1]) arranged in [1]th column 112[1] of memory cell array 102 is provided. In another example, the bit line BL[n] connected to each of the first plurality of memory cells (labeled as 110[1][n], . . . , 110[m−1][n], and 110[m][n]) arranged in [n]th column 112[n] of memory cell array 102 is provided.

At block 630 of method 600, a first complementary bit line connected to each of the first plurality of memory cells is provided. For example, bit line bar BLB[1] connected to each of the first plurality of memory cells (labeled as 110[1][1], . . . , 110[m−1][1], and 110[m][1]) arranged in [1]th column 112[1] of memory cell array 102 is provided. In another example, the bit line bar BLB[n] connected to each of the first plurality of memory cells (labeled as 110[1][n], . . . , 110[m−1][n], and 110[m][n]) arranged in [n]th column 112[n] of memory cell array 102 is provided.

At block 640 of method 600, both the first bit line and the first complementary bit line are pre-charged from a near end through a pre-charge circuit. For example, each of bit line BL[1] and bit line bar BLB[1] are pre-charged from the near end though pre-charge circuit 114. Pre-charge circuit 114 is connected to the near end of each of the bit line BL[1] and the bit line bar BLB[1].

At block 650 of method 600, both the first bit line and the first complementary bit line are pre-charged from a far end through a pre-charge assist circuit. For example, each of bit line BL[1] and bit line bar BLB[1] are pre-charged from the far end though pre-charge assist circuit 108. Pre-charge assist circuit 108 is connected to the far end of each of the bit line BL[1] and the bit line bar BLB[1]. In examples, the bit line BL[1] and the bit line bar BLB[1] are thus substantially simultaneously charged from both the near and the far end. This increases a speed of pre-charge thereby increasing the speed of read and write operations in memory device 100.

In accordance with example embodiments, a memory device comprises: a memory cell array comprising a plurality of memory cells arranged in a matrix of a plurality of rows and a plurality of columns, wherein each of the plurality of columns comprises a first plurality of memory cells connected to a first bit line and a second bit line; a pre-charge circuit connected to the memory cell array, wherein the pre-charge circuit pre-charges each of the first bit line and the second bit line from a first end; and a pre-charge assist circuit connected to the memory cell array, wherein the pre-charge assist circuit pre-charges each of the first bit line and the second bit line from a second end, the second end being opposite the first end.

In example embodiments, a memory device comprises: a first plurality of memory cells arranged in a first column of a memory cell array; a first bit line connected to each of the first plurality memory cells; a first bit line bar connected to each of the first plurality of memory cells; a pre-charge circuit connected to both the first bit line and the first bit line bar, wherein the pre-charge circuit is connected to a near end of each of the first bit line and the first bit line bar; and a pre-charge assist circuit connected to both the first bit line and the first bit line bar, wherein the pre-charge assist circuit is connected to a far end of each of the first bit line and the first complementary bit line.

In accordance with example embodiments, a method of pre-charging bit lines in a memory device comprises: providing a first plurality of memory cells arranged in a first column of a memory cell array; providing a first bit line connected to each of the first plurality memory cells; providing a first complementary bit line connected to each of the first plurality of memory cells; pre-charging both the first bit line and the first complementary bit line from a near end through a pre-charge circuit, wherein the pre-charge circuit is connected to the near end of each of the first bit line and the first complementary bit line; and pre-charging both the first bit line and the first complementary bit line from a far end through a pre-charge assist circuit, wherein the pre-charge assist circuit is connected to the far end of each of the first bit line and the first complementary bit line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
  a memory cell array comprising a plurality of memory cells arranged in a matrix of a plurality of rows and a plurality of columns, wherein each of the plurality of columns comprises a first plurality of memory cells connected to a first bit line and a second bit line;
  a pre-charge circuit connected to the memory cell array, wherein the pre-charge circuit pre-charges each of the first bit line and the second bit line from a first end; and
  a pre-charge assist circuit connected to the memory cell array, wherein the pre-charge assist circuit pre-charges each of the first bit line and the second bit line from a second end, the second end being opposite the first end.

2. The memory device of claim 1, wherein the pre-charge assist circuit comprises a transistor, wherein a source/drain of the transistor is connected to a supply voltage, wherein a drain/source of the transistor is connected to both the first bit line and the second bit line at the second end, and wherein a gate of the transistor is operable to receive pre-charge assist signal.

3. The memory device of claim 2, wherein the transistor is switched on in response to the pre-charge assist signal rising to a pre-determined value connecting both the first bit line and the second bit line to the supply voltage.

4. The memory device of claim 2, wherein the transistor comprises one the following: a p-channel Metal Oxide Semiconductor transistor (PMOS), a n-channel Metal Oxide Semiconductor transistor (NMOS), a Complementary Metal Oxide Semiconductor (CMOS), and a Metal Oxide Semiconductor Field Effect Transistor (MOSFET).

5. The memory device of claim 1, wherein the pre-charge assist circuit comprises a plurality of transistors connected in parallel to each other, wherein a source/drain of each of the plurality of transistors is connected to a supply voltage, wherein a drain/source of each of the plurality of transistors is connected to both the first bit line and the second bit line, and wherein a gate of each of the plurality of transistors is operable to receive pre-charge assist signal.

6. The memory device of claim 5, wherein a number of the plurality of transistors is determined based on a number of the first plurality of memory cells.

7. The memory device of claim 5, wherein the pre-charge assist signal is associated with a read enable signal.

8. The memory device of claim 5, wherein the pre-charge assist signal is associated with a write enable signal.

9. The memory device of claim 1, wherein each of the plurality of rows comprises a second plurality of memory cells, each of the second plurality of cells of a row being connected to a word line.

10. The memory device of claim 1, wherein the second bit line is complementary to the first bit line.

11. A memory device, comprising:
  a first plurality of memory cells arranged in a first column of a memory cell array;
  a first bit line connected to each of the first plurality memory cells;
  a first bit line bar connected to each of the first plurality of memory cells;

a pre-charge circuit connected to both the first bit line and the first bit line bar, wherein the pre-charge circuit pre-charges each of the first bit line and the first bit line bar from a near end; and a pre-charge assist circuit connected to both the first bit line and the first bit line bar, wherein the pre-charge assist circuit pre-charges each of the first bit line and the first complementary bit line from a far end.

12. The memory device of claim 11, wherein the pre-charge assist circuit comprises one or more transistors, wherein a source/drain of each of the one or more transistors is connected to a supply voltage, wherein a drain/source of each of the one or more transistors is connected to the both the first bit line and the first bit line bar, and wherein a gate of the one or more transistors is operable to receive a pre-charge signal.

13. The memory device of claim 12, wherein the one or more transistors are operative to connect both the first bit line and the first bit line bar to the supply voltage in response to the pre-charge signal attaining a predetermined logic value.

14. The memory device of claim 12, wherein a number of the one or more transistors is dependent on a number of the first plurality of memory cells.

15. The memory device of claim 12, wherein the one or more transistors are connected in parallel.

16. The memory device of claim 12, wherein the one or more transistors comprises one the following: a p-channel Metal Oxide Semiconductor transistor (PMOS), a n-channel Metal Oxide Semiconductor transistor (NMOS), a Complementary Metal Oxide Semiconductor (CMOS), and a Metal Oxide Semiconductor Field Effect Transistor (MOSFET).

17. A method of pre-charging bit lines of a memory device, the method comprising:
   providing a first plurality of memory cells arranged in a first column of a memory cell array;
   providing a first bit line connected to each of the first plurality memory cells;
   providing a first complementary bit line connected to each of the first plurality of memory cells;
   pre-charging both the first bit line and the first complementary bit line from a near end through a pre-charge circuit, wherein the pre-charge circuit is connected to the near end of each of the first bit line and the first complementary bit line; and
   pre-charging both the first bit line and the first complementary bit line from a far end through a pre-charge assist circuit, wherein the pre-charge assist circuit is connected to the far end of each of the first bit line and the first complementary bit line.

18. The method of claim 17, wherein pre-charging both the first bit line and the first complementary bit line from the far end through the pre-charge assist circuit comprises pre-charging both the first bit line and the first complementary bit line from the far end through the pre-charge assist circuit substantially simultaneously with pre-charging both the first bit line and the first complementary bit line from the near end through the pre-charge circuit.

19. The method of claim 17, wherein pre-charging both the first bit line and the first complementary bit line from the far end through the pre-charge assist circuit comprises pre-charging both the first bit line and the first complementary bit line from the far end through the pre-charge assist circuit in response to receiving a pre-charge assist signal.

20. The method of claim 19, wherein receiving the pre-charge assist signal comprises receiving the pre-charge assist signal from the pre-charge circuit.

* * * * *